United States Patent
Fujimura et al.

(10) Patent No.: US 8,206,768 B2
(45) Date of Patent: Jun. 26, 2012

(54) OXIDE MATERIAL, PATTERNING SUBSTRATE, METHOD OF FORMING A PATTERN, METHOD OF PRODUCING AN IMPRINT TRANSFER MOLD, METHOD OF PRODUCING A RECORDING MEDIUM, IMPRINT TRANSFER MOLD, AND RECORDING MEDIUM

(75) Inventors: Megumi Fujimura, Saitama (JP); Yasuo Hosoda, Saitama (JP)

(73) Assignee: Pioneer Corporation, Tokyo (JP)

( * ) Notice: Subject to any disclaimer, the term of this patent is extended or adjusted under 35 U.S.C. 154(b) by 477 days.

(21) Appl. No.: 12/443,039

(22) PCT Filed: Sep. 28, 2007

(86) PCT No.: PCT/JP2007/068965
§ 371 (c)(1),
(2), (4) Date: Apr. 27, 2009

(87) PCT Pub. No.: WO2008/047572
PCT Pub. Date: Apr. 24, 2008

(65) Prior Publication Data
US 2010/0003469 A1  Jan. 7, 2010

(30) Foreign Application Priority Data
Sep. 28, 2006 (JP) .................................. 2006-264396

(51) Int. Cl.
*B32B 9/00* (2006.01)
(52) U.S. Cl. ......................... 426/446; 428/701; 428/702
(58) Field of Classification Search .................. None
See application file for complete search history.

(56) References Cited

U.S. PATENT DOCUMENTS

| 4,634,495 A | | 1/1987 | Gobrecht et al. | |
|---|---|---|---|---|
| 5,124,311 A | * | 6/1992 | Mori et al. | 505/220 |
| 5,134,029 A | * | 7/1992 | Kuromitsu et al. | 428/336 |
| 6,846,616 B2 | * | 1/2005 | Kobayashi et al. | 430/311 |
| 7,252,923 B2 | * | 8/2007 | Kobayashi | 430/270.1 |
| 2008/0070393 A1 | * | 3/2008 | Miyairi et al. | 438/585 |

FOREIGN PATENT DOCUMENTS

| JP | 60-243284 | 12/1985 |
|---|---|---|
| JP | 2002-198495 | 7/2002 |
| JP | 2004-119414 | 4/2004 |
| JP | 2006-156422 | 6/2006 |
| JP | 2006-244694 | 9/2006 |

* cited by examiner

*Primary Examiner* — Timothy Speer
(74) *Attorney, Agent, or Firm* — Young & Thompson

(57) ABSTRACT

An oxide material (102) is used as masking for patterning by etching which is performed with respect to a substrate or a material laminated on the substrate (101). The oxide material is also used in a multi-step etching which is performed by using a resist (103) formed on the oxide material as a mask. The etching rate of the oxide material for a reaction gas containing an inert gas or hydrogen is higher than the etching rate of the resist for the reaction gas containing an inert gas or hydrogen, while the etching rate of the oxide material for a fluorine-containing gas is lower than the etching rate of the material, which is to be patterned by using the oxide material as a mask, for the fluorine-containing gas. In addition, the oxide material is soluble in a weak acid.

11 Claims, 9 Drawing Sheets

[FIG. 1]
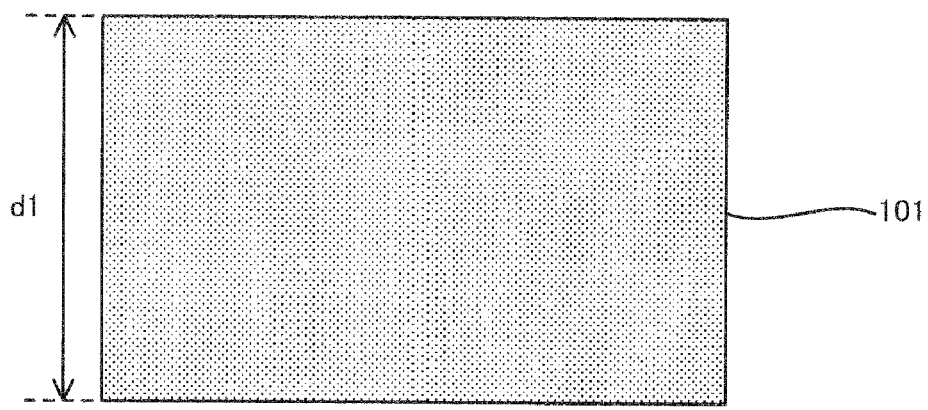
[FIG. 2]
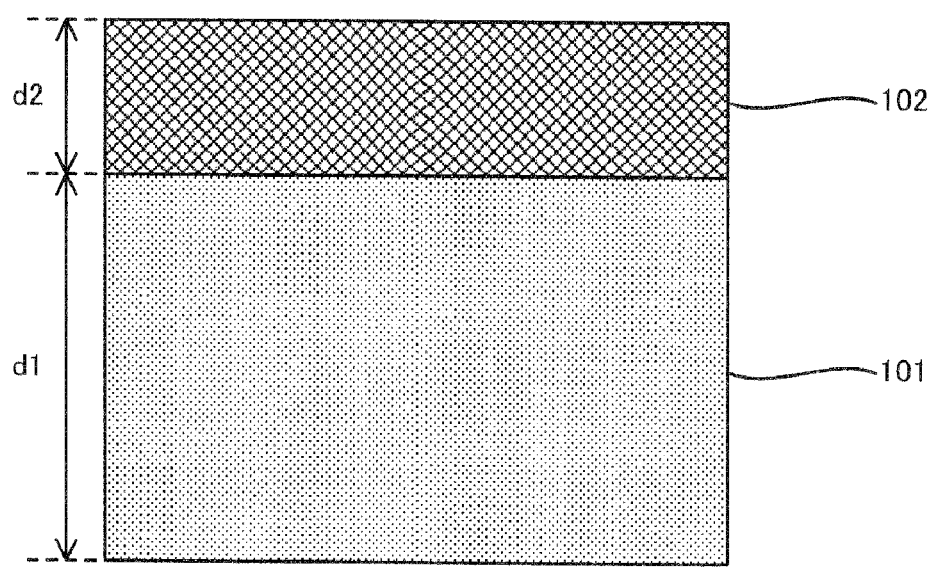

[FIG. 3]
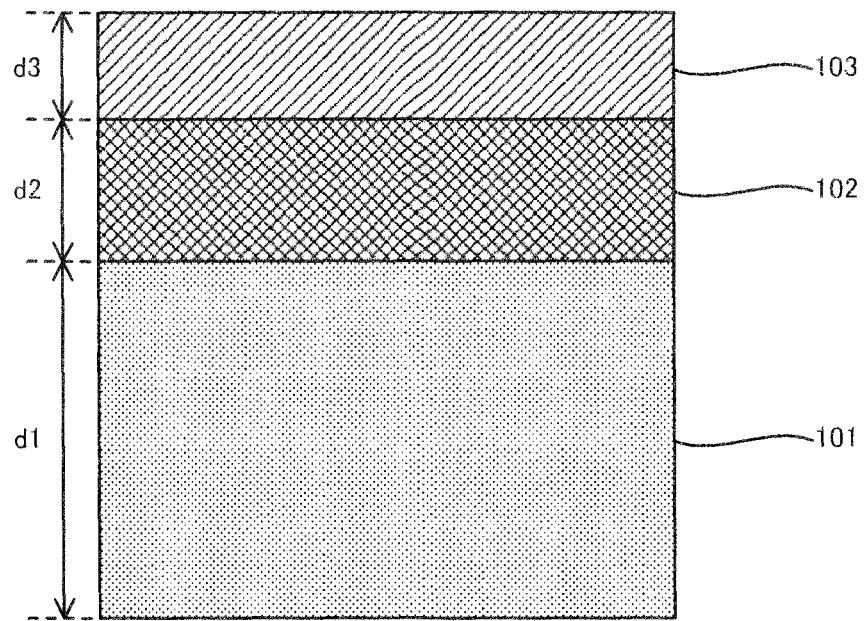
[FIG. 4]
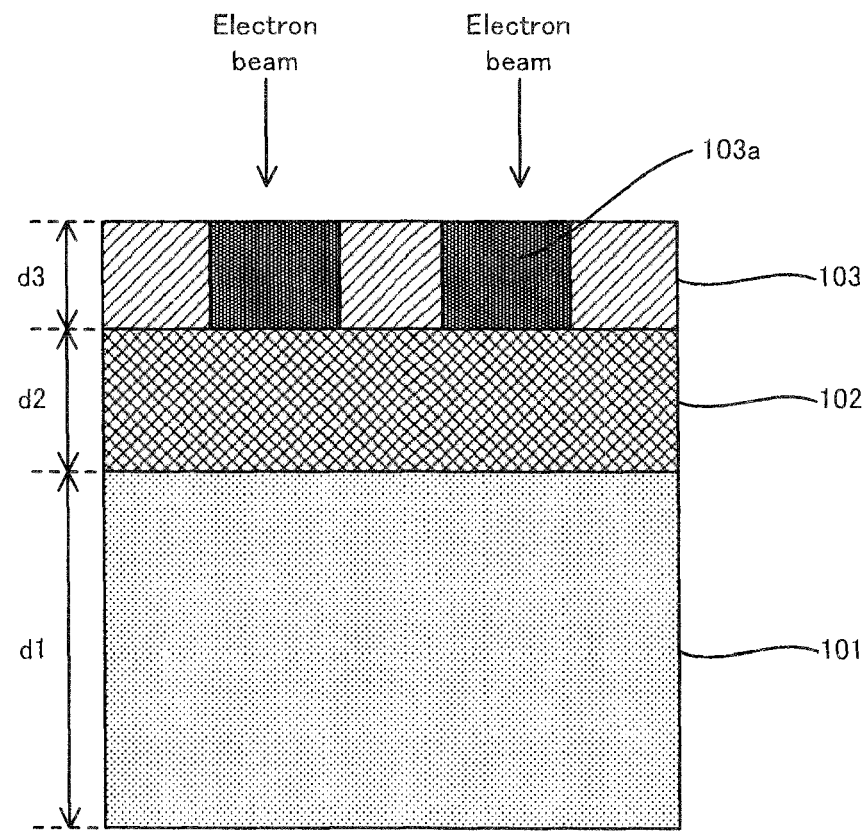

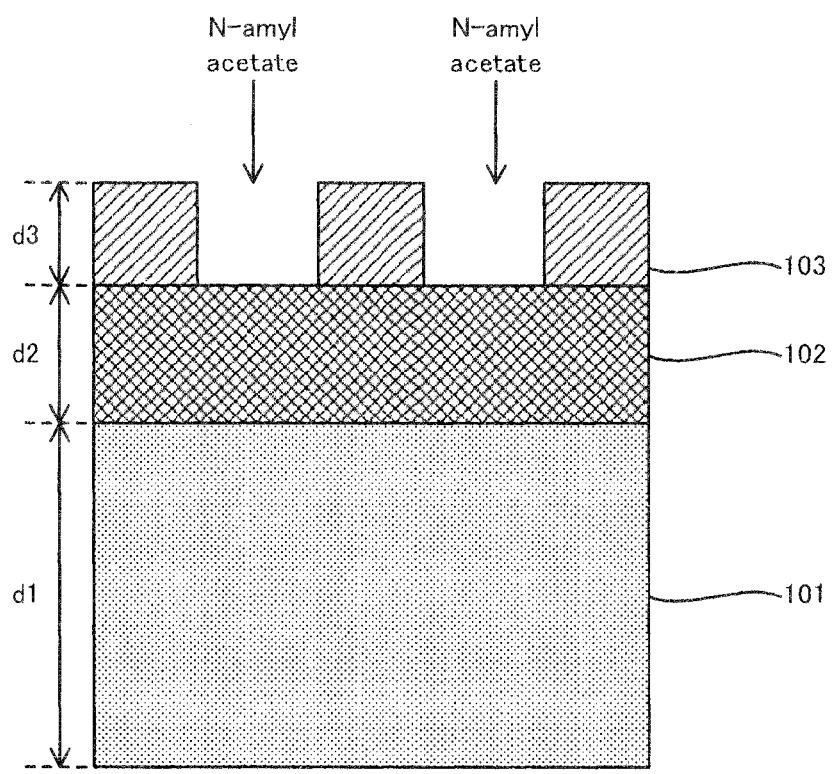
[FIG. 5]
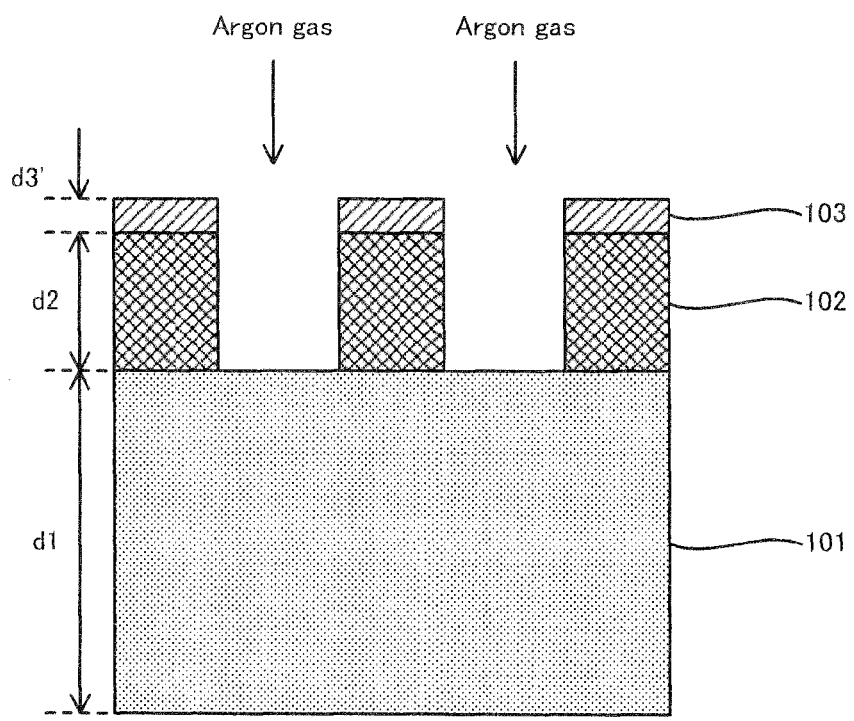
[FIG. 6]

[FIG. 7]
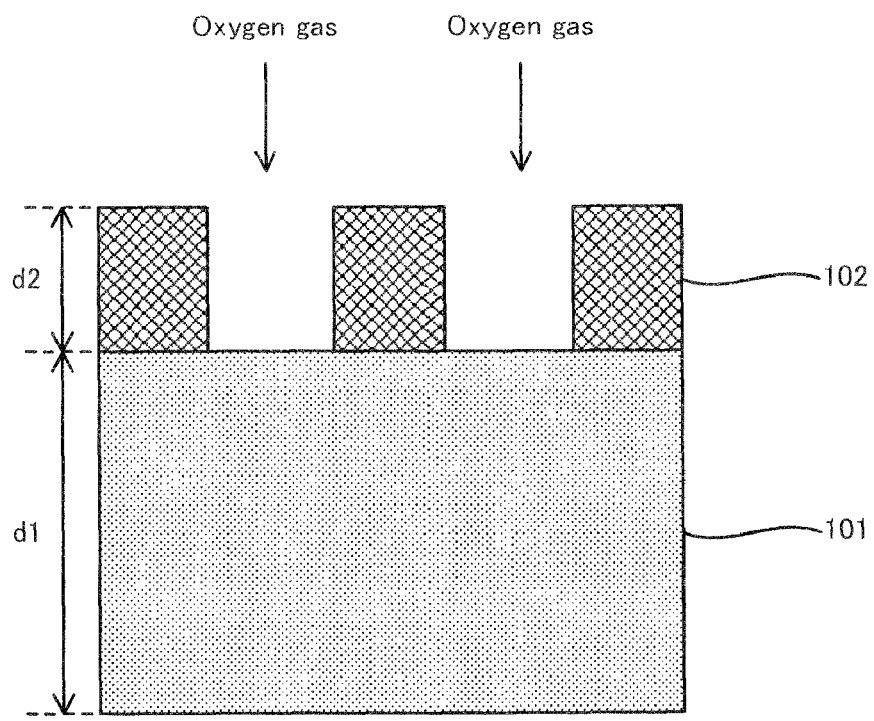
[FIG. 8]
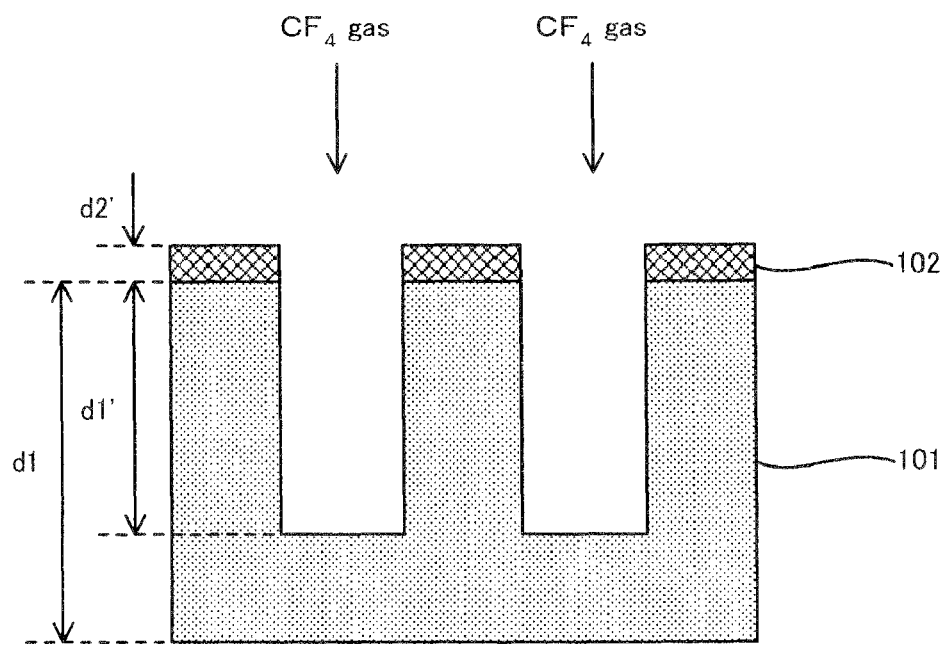

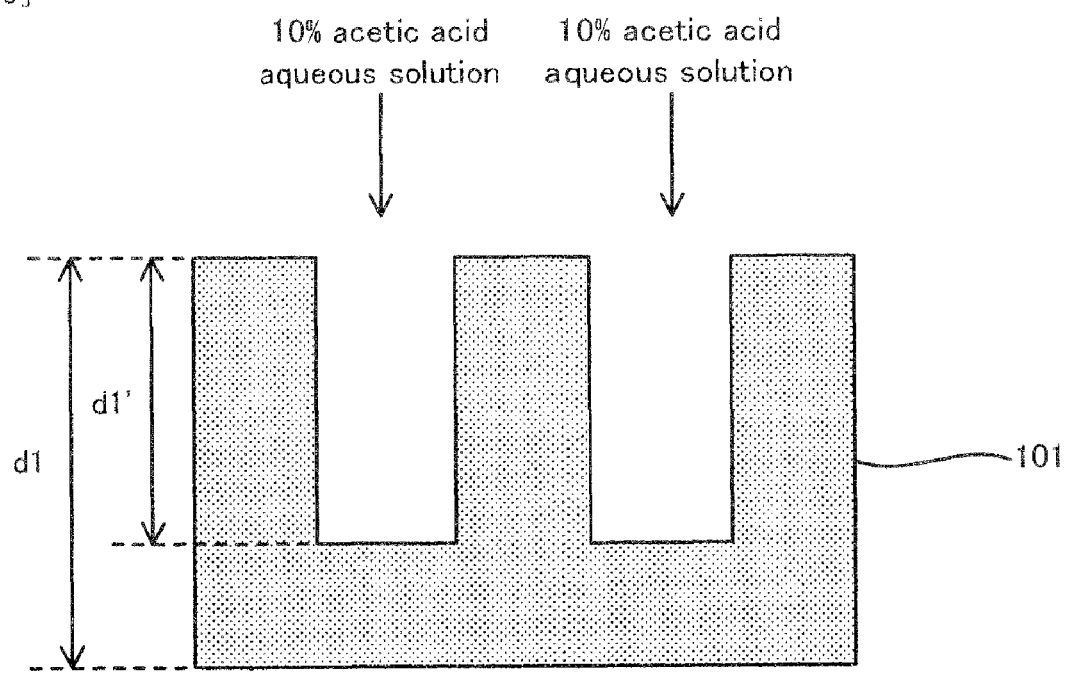
[FIG. 9]

[FIG. 10]
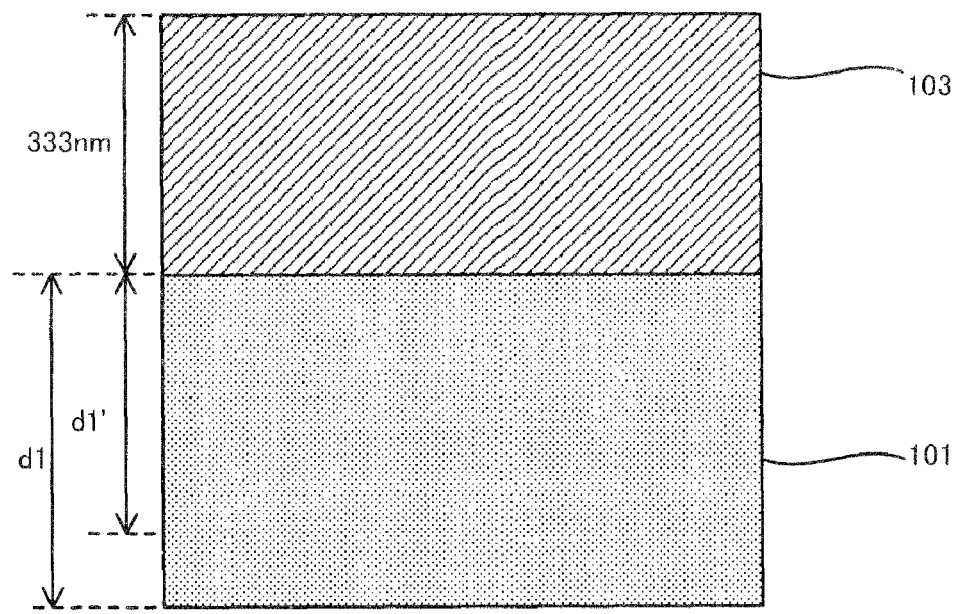
(a)
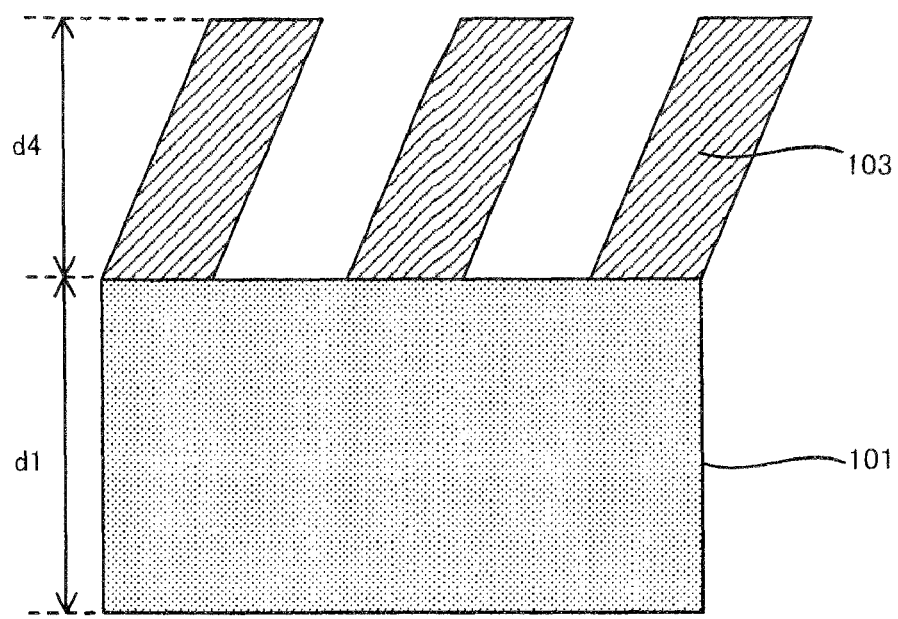
(b)

[FIG. 11]
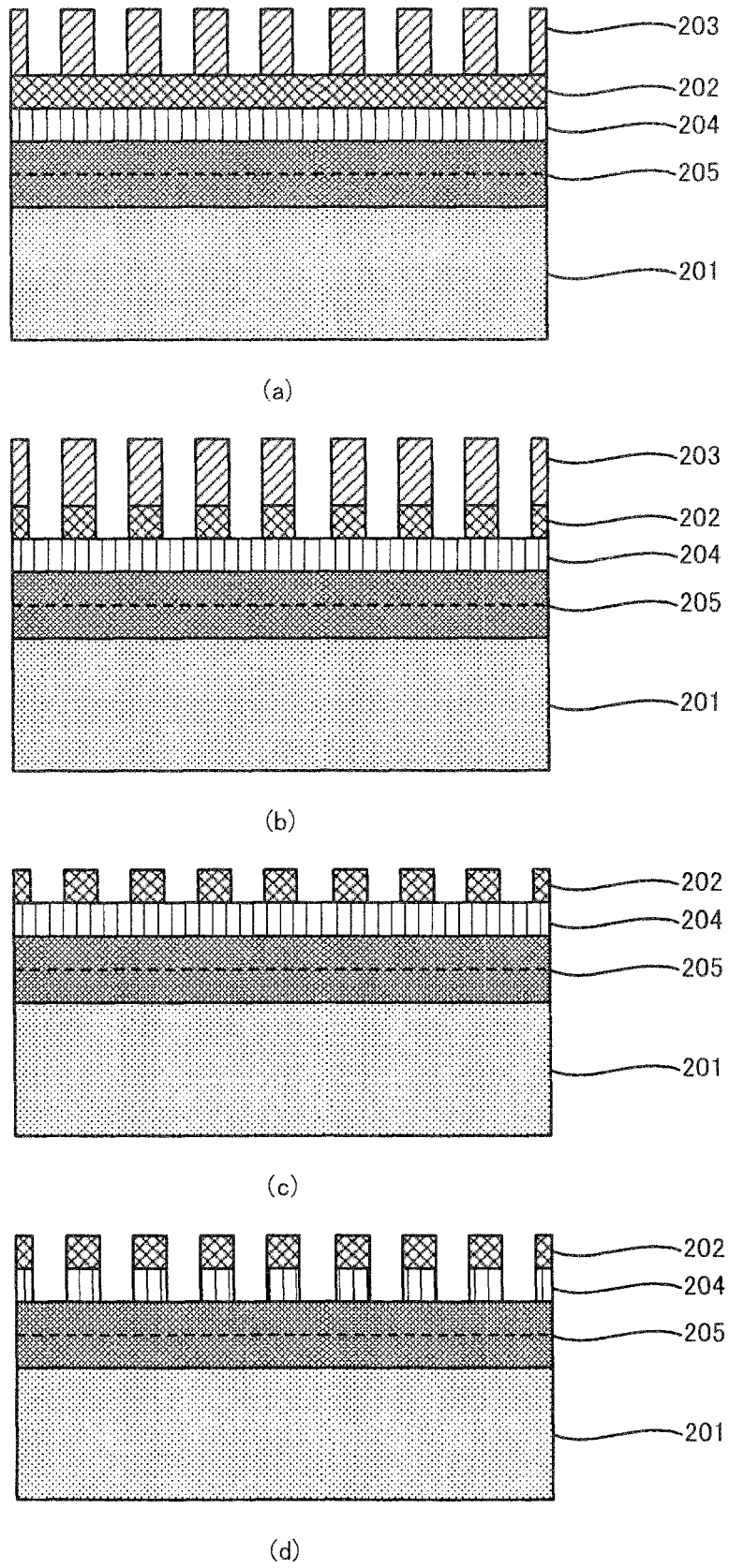

[FIG. 12]
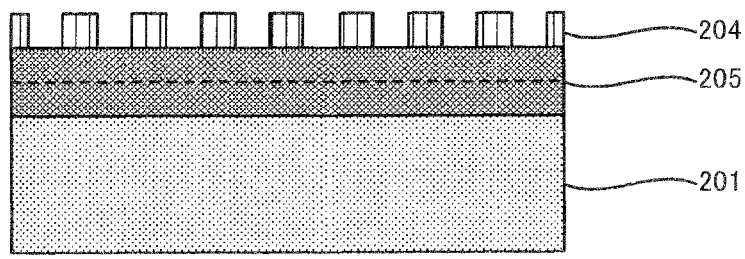
(a)
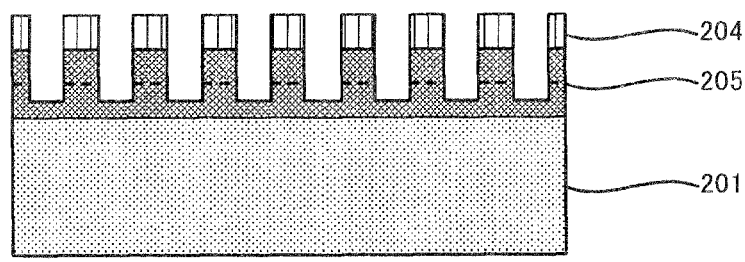
(b)
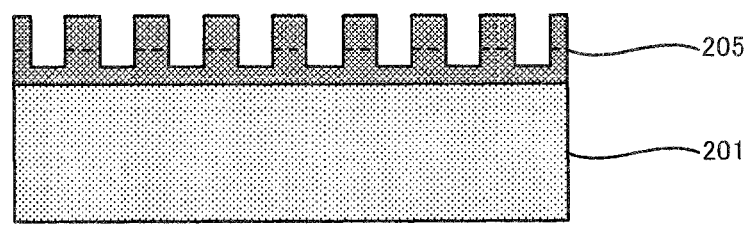
(c)
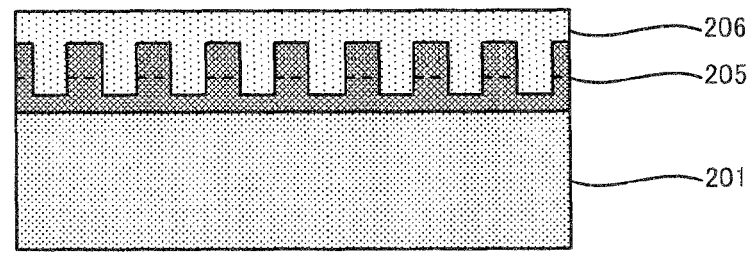
(d)
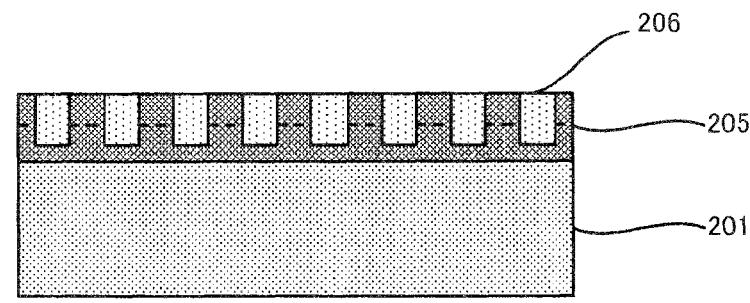
(e)

[FIG. 13]
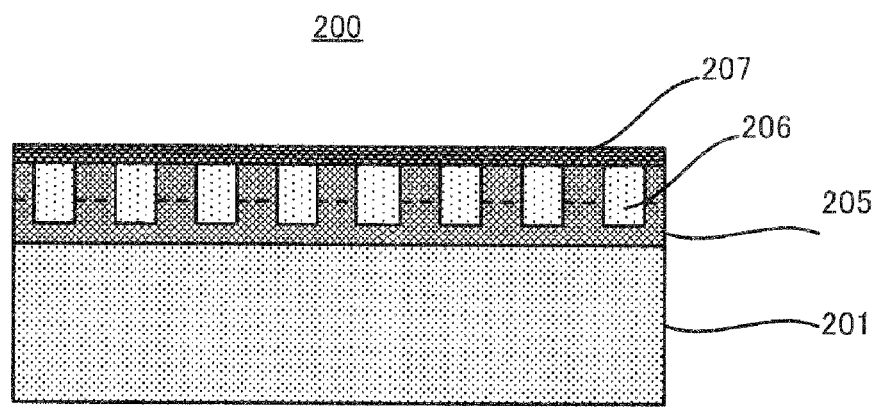

OXIDE MATERIAL, PATTERNING SUBSTRATE, METHOD OF FORMING A PATTERN, METHOD OF PRODUCING AN IMPRINT TRANSFER MOLD, METHOD OF PRODUCING A RECORDING MEDIUM, IMPRINT TRANSFER MOLD, AND RECORDING MEDIUM

TECHNICAL FIELD

The present invention relates to an oxide material, which is laminated on a substrate with a resist and which makes masking in performing patterning on a substrate; a patterning substrate in which the oxide material and the substrate are laminated; a method of forming a pattern to perform the patterning on the substrate, which is provided for the patterning substrate with the oxide material laminated thereon; a method of producing an imprint transfer mold for the patterning and a method of producing a recording medium, by such a pattern forming method; an imprint transfer mold, produced by the method of producing an imprint transfer mold; and a recording medium, produced by the method of producing a recording medium.

BACKGROUND ART

For example, as a general technology when a micropattern is formed on a substrate, there is used such a technology that a resist for masking is formed on the substrate before the resist is developed to have a micropattern shape by a lithography technique, and then an etching process or the like is performed. Such a technology is used to form the circuit pattern of a semiconductor, to form MEMS (Micro Electro Mechanical Systems) and the tracks of a recording medium such as an optical disc.

Recently, there has been developed a technology of etching the substrate more deeply by forming an oxide layer on the substrate and forming the resist on the oxide layer (refer to a patent document 1). In this technology, a two-step etching process is performed; the etching process is performed on the oxide layer with the resist being used as the masking, and the etching process is performed on the substrate with the oxide layer after the etching process being used as the masking. The two-step etching process allows the substrate to be etched more deeply than a case where only the resist with the same thickness is used to perform the etching process on the substrate.

Patent document 1: Japanese Patent Application Laying Open NO. She 60-243284

DISCLOSURE OF INVENTION

Subject to be Solved by the Invention

By the way, the aforementioned patent document 1 discloses an example of using $Al_2O_3$, $TiO_2$, MgO, and oxides of Zr, Hf, B and rare-earth elements as the oxide layer. The conventionally disclosed oxide material, however, has solubility in alkali, so there are such problems that it is corroded by the alkaline developer of a photoresist and that it is hard to remove the substrate material without corroding it in the last mask removing process. Moreover, using an electron beam has not been considered for the patterning of the resist, in order to form the finer pattern than before.

In order to solve the aforementioned problems, it is therefore an object of the present invention to provide an oxide material, which allows a more preferable etching process and which is used to form a micropattern on a substrate; a patterning substrate in which the oxide material is laminated on the substrate; a method of forming a pattern to perform a patterning process on the patterning substrate in which the oxide material is laminated on the substrate; a method of producing an imprint transfer mold for the patterning and a method of producing a recording medium, by such a pattern forming method; an imprint transfer mold, produced by the method of producing an imprint transfer mold; and a recording medium, produced by the method of producing a recording medium.

Means for Solving the Object

The above object of the present invention can be achieved by a first oxide material, which is used as masking for patterning by etching with respect to a substrate or a material laminated on the substrate and which is used in a multistage etching process performed with a resist that is used as the masking being formed on the oxide material, wherein an etching rate of the oxide material in an inert gas or a reactive gas including hydrogen is greater than that of the resist in the inert gas or the reactive gas including the hydrogen, an etching rate of the oxide material in a fluorine-based gas is less than that of the material on which the patterning is performed with the oxide material in the fluorine-based gas being used as the masking, and the oxide material is soluble in a weak acid.

The above object of the present invention can be also achieved by a second oxide material, which is used as masking for patterning by etching with respect to a substrate or a material laminated on the substrate, wherein the oxide material includes heavy-element oxide.

The above object of the present invention can be achieved by a patterning substrate, wherein a substrate and the first or second oxide material of the present invention are laminated.

The above object of the present invention can be achieved by a first method of forming a pattern, wherein patterning is performed by etching using the first or second oxide material of the present invention as the masking.

The above object of the present invention can be achieved by a second method of forming a pattern, provided with: a resist patterning process of performing patterning with respect to a resist on the patterning substrate of the present invention by forming the resist that is used as the masking on the oxide material; a first etching process of performing an etching process on the resist and the oxide material; a second etching process of performing patterning by etching with the oxide material being used as the masking; and a removing process of removing the oxide material using the weak acid.

The above object of the present invention can be achieved by a method of producing an imprint transfer mold, wherein patterning is performed by the first or second method of forming a pattern of the present invention.

The above object of the present invention can be achieved by a method of producing a recording medium, wherein patterning is performed by the first or second method of forming a pattern of the present invention.

The above object of the present invention can be achieved by an imprint transfer mold, produced by the method of producing an imprint transfer mold of the present invention.

The above object of the present invention can be achieved by a recording medium produced by the method of producing a recording medium of the present invention.

The operation and other advantages of the present invention will become more apparent from the following embodiments.

BRIEF DESCRIPTION OF DRAWINGS

FIG. 1 is a cross sectional view conceptually showing a cross section of a silicon substrate which is a target for patterning.

FIG. 2 is a cross sectional view conceptually showing a cross section of the silicon substrate and the like after one process is performed in the patterning of the silicon substrate with a bismuth oxide film as masking.

FIG. 3 is a cross sectional view conceptually showing a cross section of the silicon substrate and the like after another process is performed in the patterning of the silicon substrate with the bismuth oxide film as the masking.

FIG. 4 is a cross sectional view conceptually showing a cross section of the silicon substrate and the like after another process is performed in the patterning of the silicon substrate with the bismuth oxide film as the masking.

FIG. 5 is a cross sectional view conceptually showing a cross section of the silicon substrate and the like after another process is performed in the patterning of the silicon substrate with the bismuth oxide film as the masking.

FIG. 6 is a cross sectional view conceptually showing a cross section of the silicon substrate and the like after another process is performed in the patterning of the silicon substrate with the bismuth oxide film as the masking.

FIG. 7 is a cross sectional view conceptually showing a cross section of the silicon substrate and the like after another process is performed in the patterning of the silicon substrate with the bismuth oxide film as the masking.

FIG. 8 is a cross sectional view conceptually showing a cross section of the silicon substrate and the like after another process is performed in the patterning of the silicon substrate with the bismuth oxide film as the masking.

FIG. 9 is a cross sectional view conceptually showing a cross section of the silicon substrate and the like after another process is performed in the patterning of the silicon substrate with the bismuth oxide film as the masking.

FIG. 10 is a cross sectional view conceptually showing the external form of an electron beam resist when the bismuth oxide is not used.

FIG. 11 are schematic diagrams of a production procedure in an example of the recording medium of the present invention.

FIG. 12 are schematic diagrams of the production procedure in the example of the recording medium of the present invention.

FIG. 13 is a schematic diagram of the production procedure in the example of the recording medium of the present invention.

DESCRIPTION OF REFERENCE CODES

101 silicon substrate
102 bismuth oxide
103 electron beam resist

BEST MODE FOR CARRYING OUT THE INVENTION

Hereinafter, as the best mode for carrying out the present invention, an explanation will be given on embodiments of the oxide material, the patterning substrate, the method of forming a pattern, the method of producing an imprint transfer mold, the method of producing a recording medium, the imprint transfer mold, and the recording medium of the present invention.

Embodiments of Oxide Material

A first embodiment of the oxide material of the present invention is an oxide material, which is used as masking for patterning by etching with respect to a substrate or a material laminated on the substrate and which is used in a multistage etching process performed with a resist that is used as the masking being formed on the oxide material, wherein an etching rate of the oxide material in an inert gas or a reactive gas including hydrogen is greater than that of the resist in the inert gas or the reactive gas including the hydrogen, an etching rate of the oxide material in a fluorine-based gas is less than that of the material on which the patterning is performed with the oxide material in the fluorine-based gas being used as the masking, and the oxide material is soluble in a weak acid (e.g. mild acidic solution).

The first embodiment of the oxide material of the present invention can be used as the masking (a mask) in performing the patterning using the etching on the substrate, such as a silicon substrate, or the material laminated on the substrate (hereinafter referred to as an etched material). Moreover, the resist may be used to perform the patterning on the oxide material in the first embodiment. For example, after the oxide material is formed on the etched material and the resist is formed on the oxide material, the patterning may be performed on the resist. Then, after the patterning is performed by the etching on the oxide material with the resist being used as the masking, the oxide material may be used as the masking to perform the pattering by the etching on the etched material. Alternatively, for example, the resist is formed on the etched material, and firstly the patterning is performed on the resist, and then the oxide material in the first embodiment is formed on the resist. Then, after the patterning is performed on the oxide material by a lift-off method or the like, the oxide material may be used as the masking to perform the patterning on the etched material. At this time, the resist is preferably used as the masking in performing the etching process on the oxide material in the first embodiment. The oxide material in the first embodiment is preferably used as the masking in performing the etching process on the etched material. In other words, the resist is preferably used as the indirect masking for the etched material, by using the resist as the direct masking for the oxide material in the first embodiment. The oxide material in the first embodiment is preferably used as the direct masking for the etched material. More specifically, the resist is patterned and the patterned resist is used as the masking to perform the etching process on the oxide material, to thereby pattern the oxide material. After that, the patterned oxide material is used as the masking to perform the etching process on the etched material, to thereby pattern the etched material.

The oxide material in the first embodiment particularly has the following characteristics.

As the first characteristic, in the oxide material in the first embodiment, the etching rate of the oxide material in the first embodiment in the inert gas or the reactive gas including hydrogen, which is used for the etching process with respect to the oxide material, is greater than that of the resist in the inert gas or the reactive gas including the hydrogen. More specifically, the etching rate of the oxide material in the first embodiment in the inert gas or the reactive gas including hydrogen under a predetermined etching condition is greater than that of the resist in the inert gas or the reactive gas including hydrogen under the same etching condition. In other words, if the etching process by the inert gas or the reactive gas including hydrogen is performed on the resist and the oxide material in the first embodiment, the etching speed of the oxide material in the first embodiment is faster than that of the resist.

Then, as the second characteristic, in the oxide material in the first embodiment, the etching rate of the oxide material in the first embodiment in the fluorine-based gas, which is used for the etching process with respect to the etched material, is less than that of the etched material in the fluorine-based gas. More specifically, the etching rate of the oxide material in the first embodiment in the fluorine-based gas under a predetermined etching condition is less than that of the etched material in the fluorine-based gas under the same etching condition. In other words, if the etching process by the fluorine-based gas is performed on the oxide material in the first embodiment and the etched material, the etching speed of the oxide material in the first embodiment is slower than that of the etched material.

Lastly, as the third characteristic, the oxide material in the first embodiment has a characteristic of being soluble in the weak acid (in other words, being soluble, preferably or relatively easily). Here, the expression "the oxide material is soluble in the weak acid" indicates that the solubility of the oxide material in the first embodiment in the weak acid is greater than that of the etched material in the weak acid. Preferably, the expression indicates that the oxide material in the first embodiment is soluble in the weak acid in which the etched material is insoluble (specifically not soluble at all or hardly soluble) or poorly-soluble. More preferably, the expression indicates that the oxide material in the first embodiment is relatively easily soluble in the weak acid in which the etched material is insoluble (specifically not soluble at all or hardly soluble) or poorly-soluble. In view of such concepts, the etched material is preferably insoluble in the weak acid.

Due to the aforementioned characteristics, the following effects are achieved if the patterning is performed on the etched material using the oxide material in the first embodiment.

Firstly, since the etching rate of the oxide material in the first embodiment in the inert gas or the reactive gas including hydrogen is greater than that of the resist in the inert gas or the reactive gas including hydrogen, it is possible to etch the oxide material in the first embodiment in excess of the thickness of the resist used as the masking. Specifically, with the resist with a first thickness being used as the masking, it is possible to etch the oxide material in the first embodiment to a depth corresponding to a second thickness, which is thicker than the first thickness. In addition, since the etching rate of the oxide material in the first embodiment in the fluorine-based gas is less than that of the etched material in the fluorine-based gas, it is possible to etch the etched material in excess of the thickness of the oxide material in the first embodiment used as the masking. Specifically, with the oxide material with the second thickness being used as the masking, it is possible to etch the etched material to a depth corresponding to a third thickness, which is thicker than the second thickness. In other words, by using the relatively thin masking (specifically, the resist and the oxide material in the first embodiment), it is possible to etch the etched material, relatively thickly (i.e. deeply).

If the oxide material is not used as the masking, it is necessary to relatively thicken the resist used as the masking for the patterning with respect to the etched material. This causes that the resist left as the masking has a vertically long unstable shape, resulting in such a disadvantage that the masking is inclined or broken, which is not preferable. In the first embodiment, however, the oxide material in the first embodiment and the resist used as the masking can be relatively thinned, so that the aforementioned disadvantage does not occur.

Moreover, since the oxide material in the first embodiment is soluble in the weak acid, it is possible to remove the oxide material, without corroding the etched material which is insoluble or poorly-soluble in the weak acid. As a result, it is possible to preferably form the etched material (or the substrate) on which the patterning is performed.

As described above, by using the oxide material in the first embodiment, it is possible to more preferably perform the etching process on the etched material. As a result, it is possible to more preferably pattern the etched material.

In another aspect of the first embodiment of the oxide material of the present invention, the inert gas is argon gas.

According to this aspect, it is possible to preferably perform the etching process on the oxide material in the first embodiment, using the argon gas, while receiving the aforementioned various effects.

In another aspect of the first embodiment of the oxide material of the present invention, the reactive gas including the hydrogen is $CHF_3$ gas.

According to this aspect, it is possible to preferably perform the etching process on the oxide material in the first embodiment, using the $CHF_3$ gas, while receiving the aforementioned various effects.

In another aspect of the first embodiment of the oxide material of the present invention, the fluorine-based gas is $CF_4$ gas.

According to this aspect, it is possible to preferably perform the etching process on the etched material, using the $CF_4$ gas, while receiving the aforementioned various effects.

In another aspect of the first embodiment of the oxide material of the present invention, the oxide material is insoluble or poorly-soluble in alkali (e.g. alkaline solution).

According to this aspect, considering that the alkaline solution is used for the development of the resist in some cases, it is possible to receive the effect that the oxide material is not adversely influenced by the development of the resist. By this, it is possible to remove the unnecessary resist without having an adverse effect on the oxide material, resulting in the preferable patterning of the resist. By this, by using the patterned resist as the masking, it is possible to preferably perform the patterning on the oxide material.

Incidentally, the expression "the oxide material is insoluble or poorly-soluble in alkali" herein indicates that the solubility of the oxide material in the first embodiment in alkali is less than that of the resist in alkali. Preferably, the expression indicates that the oxide material in the first embodiment is insoluble (specifically not soluble at all or hardly soluble) in alkali in which the resist is soluble (specifically, soluble relatively easily).

In one aspect of the oxide material in the first embodiment, the oxide material includes heavy-element oxide (more preferably, oxide of heavy element with the atomic number of 37 or more).

According to this aspect, in a case where the pattern is drawn (i.e. exposed) on the resist by an electron beam lithography technique, even if the electron beam irradiated on the resist is transmitted through the oxide material located on the rear side of the resist and even if the transmitted electron beam is scattered in the etched material located on the further rear side, the oxide material including the heavy-element oxide can preferably prevent the electron beam scattered in the etched material from being directed to the resist. Specifically, the oxide material including the heavy-element oxide reflects the electron beam scattered in the etched material, by which the electron beam can be preferably prevented from being directed to the resist.

If the oxide material includes light metal oxide or the like, as in the technologies presented in the aforementioned Background Art, the electron beam scattered in the etched material is transmitted through the oxide material, resulting in a disadvantage of increasing the back-exposure of the resist. According to this aspect, however, it is possible to prevent the back-exposure of the resist, resulting in maintaining the high patterning accuracy of the resist. This is a great advantage when the oxide material is formed on the etched material and the resist is formed on the oxide material.

In addition, since the oxide material includes the heavy-element oxide, the oxide material is etched by the inert gas more easily than the resist. This is preferable in realizing the characteristic that "the etching rate of the oxide material in the inert gas is greater than that of the resist in the inert gas", as described above.

In one aspect of the oxide material in the first embodiment, the oxide material made of the heavy-element may be bismuth oxide. By virtue of such construction, the aforementioned various effects can be preferably received.

Moreover, according to this aspect, bismuth is a heavy-element, and it is an element with a small electron affinity of the heavy element, so it is poorly reactive with the electron beam. Thus, the high-energy electron beam can be transmitted through the oxide material located on the rear side of the resist, relatively easily, and further to the etched material located on the rear side of the oxide material. Moreover, since bismuth is the heavy-element, it is possible to preferably prevent the electron beam whose energy is reduced due to the scattering in the etched material, from bouncing back to the resist. By this, it is possible to prevent the back-exposure of the resist, resulting in maintaining the high patterning accuracy of the resist.

In an aspect of the oxide material in which the heavy-element oxide is bismuth oxide, as described above, $0.4 \leq x \leq 0.5$ may be established if relative proportions of bismuth and oxygen in the bismuth oxide is x:1−x.

By virtue of such construction, it is possible to realize the oxide material including the bismuth oxide having the stable composition.

Moreover, compared to pure bismuth, as the content of oxygen (oxidation rate) increases, the solubility of the bismuth oxide in the weak acid increases. This is preferable in realizing the aforementioned "characteristic of being soluble in the weak acid (in other words, it is soluble, preferably or relatively easily)".

On the other hand, as the content of oxygen reduces, the solubility of the bismuth oxide in the weak acid reduces, but its electrical conductivity increases. The increased electrical conductivity allows the following effect to be received; namely, it is possible to prevent the charge-up of electrons to the oxide material in the exposure of the resist by the irradiation of the electron beam.

In view of the two trade-off relations, by bringing the relative proportions of bismuth and oxygen close to x:1−x (wherein 0.4□x□0.5), it is possible to realize the following two characteristics in a more preferable condition: being soluble in the weak acid and preventing the charge-up of electrons.

A second embodiment of the oxide material of the present invention is an oxide material, which is used as masking for patterning by etching with respect to a substrate or a material laminated on the substrate (or etched material), wherein the oxide material includes heavy-element oxide (more preferably, oxide of heavy element with the atomic number of 37 or more).

According to the second embodiment of the oxide material of the present invention, it is possible to receive the same effects as those of the oxide material in the first embodiment described above. It is also possible to preferably receive the various effects caused by the heavy-element oxide, because the oxide material includes the heavy-element oxide.

Incidentally, in response to the various aspects in the first embodiment of the oxide material of the present invention, the second embodiment of the oxide material of the present invention can also adopt various aspects.

In an aspect of the oxide material including the heavy-element oxide, as described above, the heavy-element oxide may be bismuth oxide.

By virtue of such construction the following various effects can be received.

Firstly, since the bismuth oxide has a stable composition described later, it is possible to realize the oxide material which is safe and easy in handling.

Moreover, since the oxide material includes the bismuth oxide, the oxide material is etched by the inert gas (particularly, argon gas) or the reactive gas including hydrogen, more easily than the resist. This is preferable in realizing the characteristic that "the etching rate of the oxide material in the inert gas or the reactive gas including hydrogen (particularly $CHF_3$ gas) is greater than that of the resist in the inert gas or the reactive gas including the hydrogen".

Moreover, since the oxide material includes the bismuth oxide, the oxide material is etched by the fluorine-based gas (particularly, $CF_4$ gas generally used for the etching process on the etched material) more hardly than the etched material (e.g. silicon, silicon dioxide, or the like). This is preferable in realizing the characteristic that "the etching rate of the oxide material in the fluorine-based gas is greater than that of the etched material in the fluorine-based gas".

Moreover, since the oxide material includes the bismuth oxide, the oxide material is easily soluble in the weak acid. This is preferable in realizing the "characteristic being soluble in the weak acid (in other words, being soluble, preferably or relatively easily)".

On the other hand, as the content of oxygen reduces, the solubility of the bismuth oxide in the weak acid reduces, but its electrical conductivity increases. The increased electrical conductivity allows the following effect to be received; namely, it is possible to prevent the charge-up of electrons to the oxide material in the exposure of the resist by the irradiation of the electron beam.

In view of the two trade-off relations, by bringing the relative proportions of bismuth and oxygen close to x:1−x (wherein 0.4□x□0.5), it is possible to realize the following two characteristics in a more preferable condition: being soluble in the weak acid and preventing the charge-up of electrons.

Embodiment of Patterning Substrate

An embodiment of the patterning substrate of the present invention is a patterning substrate, wherein a substrate and the first or second embodiment of the oxide material of the present invention (including its various aspects) are laminated.

According to the embodiment of the patterning substrate of the present invention, by patterning the material with the patterning substrate, it is possible to receive the same various effects as those received by the first or second embodiment of the oxide material of the present invention.

Incidentally, in response to the first or second embodiment of the oxide material of the present invention, the embodiment of the patterning substrate of the present invention can also adopt various aspects.

Embodiment of Method of Forming A Pattern

A first embodiment of the method of forming a pattern of the present invention is a method of forming a pattern, wherein patterning is performed by etching using the first or second embodiment of the oxide material of the present invention (including its various aspects) as the masking.

According to the first embodiment of the method of forming a pattern of the present invention, it is possible to form the patterning on the etched material while receiving the same various effects as those received by the first or second embodiment of the oxide material of the present invention.

Incidentally, in response to the various aspects of the first or second embodiment of the oxide material of the present invention, the first embodiment of the method of forming a pattern of the present invention can also adopt various aspects.

In one aspect of the first embodiment of the method of forming a pattern of the present invention, it is provided with a removing process of removing the oxide material using the weak acid after the patterning is performed by the etching using the oxide material according to claim 1 as the masking.

According to this aspect, since the oxide material is soluble is in the weak acid, it is possible to remove the oxide material, without corroding the etched material which is insoluble or poorly-soluble in the weak acid. As a result, it is possible to preferably form the etched material (or the substrate) on which the patterning is performed.

A second embodiment of the method of forming a pattern of the present invention is a method of forming a pattern, provided with: a resist patterning process of performing patterning with respect to a resist on the patterning substrate according to claim 9 by forming the resist that is used as the masking on the oxide material; a first etching process of performing an etching process on the resist and the oxide material; a second etching process of performing patterning by etching with the oxide material being used as the masking; and a removing process of removing the oxide material using the weak acid.

According to the second embodiment of the method of forming a pattern of the present invention, by the operation in the resist patterning process, after the resist is formed on the oxide material by e.g. spin coating, the patterning is performed on the resist by e.g. the electron beam lithography technology. After that, the etching process is performed by the operation in the first etching process, on the resist and the oxide material, with the resist being used as the masking, with the inert gas or the reactive gas including hydrogen. At this time, since the etching rate of the oxide material in the inert gas or the reactive gas including hydrogen is greater than that of the resist in the inert gas or the reactive gas including hydrogen, it is possible to etch the oxide material in excess of the thickness of the resist used as the masking.

Then, after the resist is removed with oxygen plasma, alkaline solution, or the like, as occasion demands, the etching process is performed by the operation in the second etching process, on the oxide material and the etched material, with the oxide material being used as the masking, with the fluorine-based gas. At this time, since the etching rate of the oxide material in the fluorine-based gas is less than that of the etched material in the fluorine-based gas, it is possible to etch the etched material in excess of the thickness of the oxide material used as the masking.

After that, the oxide material left on the etched material is removed by the weak acid. By this, it is possible to form the etched material (or the substrate) on which the patterning is performed.

As described above, according to the method of forming a pattern in the second embodiment, as in the oxide material in the first or second embodiment described above, by using the relatively thin masking (specifically, the resist and the oxide material in the first embodiment), it is possible to etch the etched material, relatively thickly (i.e. deeply).

In addition, since the oxide material is soluble in the weak acid, it is possible to remove the oxide material, without corroding the etched material which is insoluble or poorly-soluble in the weak acid. As a result, it is possible to preferably form the etched material (or the substrate) on which the patterning is performed.

In conclusion, according to the method of forming a pattern in the second embodiment, it is possible to more preferably perform the etching process on the etched material. As a result, it is possible to pattern the etched material, more preferably. In other words, it is possible to receive the same various effects as those received by the oxide material in the first or second embodiment described above.

Incidentally, in response to the various aspects of the first or second embodiment of the oxide material of the present invention, the second embodiment of the method of forming a pattern of the present invention can also adopt various aspects.

In one aspect of the second embodiment of the method of forming a pattern of the present invention, the resist patterning process performs the patterning with respect to the resist using an electron beam.

According to this aspect, in a case where the pattern is drawn (i.e. exposed) on the resist by the electron beam lithography technique by the operation in the resist patterning process, even if the electron beam irradiated on the resist is transmitted through the oxide material and even if the transmitted electron beam is scattered in the etched material, the oxide material including the heavy-element oxide can preferably prevent the electron beam scattered in the etched material from being directed to the resist. As a result, it is possible to maintain the high patterning accuracy of the resist. This is a great advantage when the oxide material is formed on the etched material and the resist is formed on the oxide material.

In addition, since the oxide material includes the heavy-element oxide, the oxide material is etched by the inert gas or the reactive gas including hydrogen, more easily than the resist. This is preferable in realizing the characteristic that "the etching rate of the oxide material in the inert gas or the reactive gas including hydrogen is greater than that of the resist in the inert gas or the reactive gas including hydrogen", as described above.

Embodiment of Method of Producing an Imprint Transfer Mold

An embodiment of the method of producing an imprint transfer mold of the present invention is a method of producing an imprint transfer mold, by performing patterning on the etched material on the substrate (or the substrate itself) using the first or second embodiment of the method of forming a pattern of the present invention (including its various aspects).

According to the embodiment of the method of producing an imprint transfer mold of the present invention, it is possible to produce an imprint transfer mold while receiving the aforementioned various effects.

Embodiment of Method of Producing a Recording Medium

An embodiment of the method of producing a recording medium of the present invention is a method of producing a recording medium by performing indirect or direct patterning on a recording material on the substrate, using the first or second embodiment of the method of forming a pattern of the present invention (including its various aspects).

According to the embodiment of the method of producing a recording medium of the present invention, it is possible to produce a recording medium while receiving the aforementioned various effects.

Embodiment of Imprint Transfer Mold

An embodiment of the imprint transfer mold of the present invention is produced by the embodiment of the method of producing an imprint transfer mold of the present invention.

According to the embodiment of the imprint transfer mold of the present invention, it is possible to perform an imprint process, using the imprint transfer mold produced while receiving the aforementioned various effects.

Embodiment of Recording Medium

An embodiment of the recording medium of the present invention is produced by the method of producing a recording medium of the present invention.

According to the embodiment of the recording medium of the present invention, it is possible to perform various recording operations and various reproduction operations, using the recording medium produced while receiving the aforementioned various effects.

The operation and other advantages of the present invention will become more apparent from the following examples.

As explained above, according to the first embodiment of the oxide material of the present invention, the etching rate of the oxide material in the inert gas or the reactive gas including hydrogen is greater than that of the resist in the inert gas or the reactive gas including the hydrogen, the etching rate of the oxide material in the fluorine-based gas is less than that of the substrate in the fluorine-based gas being used as the masking, and the oxide material is soluble in the weak acid. According to the second embodiment of the oxide material of the present invention, it includes the heavy-element oxide. According to the embodiment of the pattering substrate of the present invention, the substrate and the first or second embodiment of the oxide material of the present invention are laminated According to the first embodiment of the method of forming a pattern of the present invention, the patterning is performed by the etching, with the first or second embodiment of the oxide material of the present invention being used as the masking. According to the second embodiment of the method of forming a pattern of the present invention, it is provided with the resist patterning process, the first etching process, and the second etching process. According to the embodiment of the method of producing an imprint transfer mold of the present invention, the patterning is performed by the first or second embodiment of the method of forming a pattern of the present invention. According to the embodiment of the method of producing a recording medium of the present invention, the patterning is performed by the first or second embodiment of the method of forming a pattern of the present invention. The embodiment of the imprint transfer mold of the present invention is produced by the embodiment of the method of producing an imprint transfer mold of the present invention. The embodiment of the recording medium of the present invention is produced by the embodiment of the method of producing a recording medium of the present invention.

EXAMPLE

Hereinafter, an example of the present invention will be explained on the basis of the drawings.

With respect to FIG. 1 to FIG. 10, an explanation will be given on each process in the pattering of a silicon substrate with a bismuth oxide (BiO), which is one specific example of the oxide material of the present invention, as the masking. FIG. 1 is a cross sectional view conceptually showing a cross section of a silicon substrate which is a target for patterning. FIG. 2 is a cross sectional view conceptually showing a cross section of the silicon substrate and the like after one process is performed in the patterning of the silicon substrate with a bismuth oxide film as masking. FIG. 3 is a cross sectional view conceptually showing cross section of the silicon substrate and the like after another process is performed in the patterning of the silicon substrate with the bismuth oxide film as the masking. FIG. 4 is a cross sectional view conceptually showing a cross section of the silicon substrate and the like after another process is performed in the patterning of the silicon substrate with the bismuth oxide film as the masking. FIG. 5 is a cross sectional view conceptually showing a cross section of the silicon substrate and the like after another process is performed in the patterning of the silicon substrate with the bismuth oxide film as the masking. FIG. 6 is a cross sectional view conceptually showing a cross section of the silicon substrate and the like after another process is performed in the patterning of the silicon substrate with the bismuth oxide film as the masking. FIG. 7 is a cross sectional view conceptually showing a cross section of the silicon substrate and the like after another process is performed in the patterning of the silicon substrate with the bismuth oxide film as the masking. FIG. 8 is a cross sectional view conceptually showing a cross section of the silicon substrate and the like after another process is performed in the patterning of the silicon substrate with the bismuth oxide film as the masking. FIG. 9 is a cross sectional view conceptually showing a cross section of the silicon substrate and the like after another process is performed in the patterning of the silicon substrate with the bismuth oxide film as the masking. FIG. 10 is a cross sectional view conceptually showing the external form of an electron beam resist when the bismuth oxide is not used.

Each process in the patterning of a silicon substrate 101 with a thickness of d1 as shown in FIG. 1 will be explained below. The thickness d1 of the silicon substrate 101 may be arbitrarily set in accordance with the application of the silicon substrate 101; however, it is preferably at least several hundreds nm to several hundreds μm, in view of the thicknesses of a bismuth oxide film 102 and a resist 103 describe later.

As shown in FIG. 2, firstly, the bismuth oxide film 102 is formed on the upper surface of the silicon substrate 101. The bismuth oxide film 102 is used as the masking in performing an etching process on the silicon substrate 101.

In the example, the bismuth oxide film 102 is formed on the silicon substrate 101 by reactive sputtering, which uses, for example, a sputtering apparatus made by ANELVA. Here, for example, bismuth is used as a target, 80 sccm argon gas (Ar)

and 10 sccm oxygen gas ($O_2$) are used as a sputter gas, and a sputter power is set to 150 W. Moreover, for example, 18 nm is set as a thickness d2 of the bismuth oxide film 102.

The composition of the bismuth oxide film 102 is preferably $Bi_2O_3$. The bismuth oxide film 102, however, is not necessarily (i.e. not 100%) pure $Bi_2O_3$, and it may include the followings as additives or impurities: metal such as Ti (titanium), V (vanadium), Cr (chromium), Mn (manganese), Fe (iron), Co (cobalt), Ni (nickel), Cu (copper), Zn (zinc), Zr (zirconium), iNb (niobium), Mo (molybdenum), Ru (ruthenium), Pd (palladium), Ag (silver), Cd (cadmium), Ta (tantalum), W (tungsten), Pt (platinum), Au (gold), Al (aluminum), Si (silicon), Ga (gallium), Ge (germanium), In (indium), Sn (tin), Sb (antimony), Mg (magnesium), Ca (calcium), and Sr (strontium); nitrogen (or metal nitride); carbon (or metal carbide); sulfur (or metal sulfide); and the like. Of course, materials other than the above may be included as the additives or impurities.

As described above, the substrate with the bismuth film 102 formed on the silicon substrate 101 constitutes one specific example of the "patterning substrate" of the present invention.

Then, as shown in FIG. 3, an electron beam resist (trade name: ZEP-520A) 103, in which an acrylic resin is a base polymer, is formed on the bismuth oxide film 102, for example, by spin coating. For example, 50 nm is set as a thickness d3 of the electron beam resist 103.

Incidentally, in the example, the bismuth oxide film 102 has the following characteristics.

Firstly, the etching rate of the bismuth oxide film 102 to argon gas or $CHF_3$ gas used for the etching process of the bismuth oxide film 102 (refer to FIG. 6) is greater than that of the electron beam resist 103 to the argon gas or $CHF_3$ gas. Specifically, the etching rate of the bismuth oxide film 102 to the argon gas or $CHF_3$ gas under a predetermined etching condition (e.g. an etching condition described later) is greater than that of the electron beam resist 103 to the argon gas or $CHF_3$ gas under the same etching condition. In the example, an etching selection ratio between the bismuth oxide film 102 and the electron beam resist 103 with respect to the argon gas or $CHF_3$ gas (i.e. etching rate of the bismuth oxide film 102/ etching rate of the electron beam resist 103) is 1.1 in the both gases. Therefore, if the etching process by the argon gas or $CHF_3$ gas is performed on the bismuth oxide film 102 with the electron beam resist 103 being used as the masking, then the etching speed of the bismuth oxide film 102 is approximately 1.1 times greater than the etching speed of the electron beam resist 103.

Moreover, the etching rate of the bismuth oxide film 102 to $CF_4$ gas used for the etching process of the silicon substrate 101 (refer to FIG. 8) is less than that of the silicon substrate 101 to the $CF_4$ gas. Specifically, the etching rate of the bismuth oxide film 102 to the $CF_4$ gas under a predetermined etching condition (e.g. an etching condition described later) is less than that of the silicon substrate 101 to the $CF_4$ gas under the same etching condition. In the example, an etching selection ratio between the silicon substrate 101 and the bismuth oxide film 102 (i.e. etching rate of the silicon substrate 101/ etching fate of the bismuth oxide film 102) is 13.1. Therefore, if the etching process by the $CF_4$ gas is performed on the silicon substrate 101 with the bismuth oxide film 102 being used as the masking, then the etching speed of the silicon substrate 101 is approximately 13.1 times greater than the etching speed of the bismuth oxide film 102.

Moreover, the bismuth oxide film 102 is insoluble or poorly-soluble in organic solvent such as n-amyl acetate (trade name: ZED-N50) used for the development of the electron beam resist 103, and in alkaline solution such as TMAH (tetramethylammonium hydroxide solution) used for the development of a chemically-amplified electron beam resist and a photoresist.

Moreover, the bismuth oxide film 102 is soluble relatively easily in a weak acid such as 10% acetic acid aqueous solution and 5% nitric acid aqueous solution.

Then, as shown in FIG. 1, a patterning process is performed on the electron beam resist 103. Specifically, for example, a line pattern with a track pitch of 320 nm (line width 130 nm) is drawn on the electron beam resist 103, with an electron beam drawing apparatus made by Pioneer. As a result, a latent image 103a is formed in a portion of the electron beam resist 103 irradiated with an electron beam (i.e. a portion exposed to the electron beam). In other words, the pattern drawing is performed on the electron beam resist 103 by the electron beam lithography technique.

Then, as shown in FIG. 5, a development process is performed on the electron beam resist 103. Specifically, the latent image 103a is dissolved by dipping which uses n-amyl acetate. As a result, the remaining pattern of the electron beam resist 103 is used as the masking in etching the bismuth oxide film 102.

Incidentally, in the example, such a positive electron beam resist 103 is used that the latent image 103a as the portion irradiated with the electron beam is dissolved and that the other portion remains except the latent image 103a. However, it will be understood that such a negative electron beam resist 103 may be used that the latent image 103a as the portion irradiated with the electron beam remains and that the other portion is dissolved except the latent image 103a.

Then, as shown in FIG. 6, while the pattern of the electron beam resist 103 is used as the masking, the etching process is performed on the bismuth oxide film 102. Specifically, for example, the bismuth oxide film 102 is etched by 18 nm by an ICP-RIE (Inductive Coupled Plasma Reactive Ion Etching) apparatus made by ULVAC. Here, the etching process can be performed under the following two etching conditions. As the first example, the etching process is performed for 300 seconds under the condition that 10 sccm argon gas is used as an etching gas, that an etching pressure (i.e. a pressure in a chamber) is set to 0.1 Pa, that an etching power is set such that an antenna power is 50 W and such that a bias power is 10 W, and that a substrate temperature is set to 20° C. As a result, as shown in FIG. 6, the bismuth oxide film 102 is removed which corresponds to the portion in which the electron beam resist 103 is not formed, and the bismuth oxide film 102 remains which corresponds to the portion in which the electron beam resist 103 is formed. Next, as the second example, the etching process is performed for 80 seconds under the condition that 30 sccm $CHF_3$ gas is used as the etching gas, that the etching pressure (i.e. the pressure in a chamber) is set to 0.5 Pa, that the etching power is set such that the antenna power is 50 W and such that the bias power is 30 W, and that the substrate temperature is set to 20° C. As a result, as shown in FIG. 6, the bismuth oxide film 102 is removed which corresponds to the portion in which the electron beam resist 103 is not formed, and the bismuth oxide film 102 remains which corresponds to the portion in which the electron beam resist 103 is formed.

At this time, in both cases where the argon gas or $CHF_3$ gas is selected as the etching gas, the etching selection ratio between the bismuth oxide film 102 and the electron beam resist 103 is 1.1. Thus, while the bismuth oxide film 102 is etched by 18 nm, the electron beam resist 103 is etched by about 16 nm. Therefore, a thickness d3' of the electron beam resist 103 after the etching process in FIG. 6 is about 34 nm.

Then, as shown in FIG. 7, a process of removing the remaining electron beam resist 103 (in other words, the etching process) is performed. Specifically, for example, the process of removing the electron beam resist 103 is performed by the ICP-RIE apparatus made by ULVAC. Here, in particular, 50 sccm oxygen gas ($O_2$ gas) is used as the etching gas. Moreover, the etching process is performed for 300 seconds under the condition that the etching pressure (i.e. the pressure in a chamber) is set to 0.5 Pa, that the etching power is set such that the antenna power is 300 W and such that the bias power is 20 W, and that the substrate temperature is set to 20° C. As a result, as shown in FIG. 7, the electron beam resist 103 left on the bismuth oxide film 102 is removed. The pattern of the remaining bismuth oxide film 102 is used as the masking in etching the silicon substrate 101.

Then, as shown in FIG. 8, while the pattern of the bismuth oxide film 102 is used as the masking, the etching process is performed on the silicon substrate 101. Specifically, for example, the silicon substrate 101 is etched by the ICP-RIE apparatus made by ULVAC. Here, for example, the etching process is performed under the following etching condition. Firstly, 30 sccm $CF_4$ gas is used as the etching gas. Moreover, the etching process is performed under the condition that the etching pressure is set to 0.5 Pa, that the etching power is set such that the antenna power is 50 W and such that the bias power is 10 W, and that the substrate temperature is set to 20° C. As a result, as shown in FIG. 6, the bismuth oxide film 102 is removed which corresponds to the portion in which the electron beam resist 103 is not formed, and the bismuth oxide film 102 remains which corresponds to the portion in which the electron beam resist 103 is formed.

At this time, since the etching selection ratio between the silicon substrate 101 and the bismuth oxide film 102 is 13.1, the silicon substrate 101 can be etched by 13.1X nm at most, by using the masking of the bismuth oxide film 102 with a thickness of X nm. In the example, since the bismuth oxide film 102 used as the masking is 18 nm thick, the silicon substrate 101 can be etched by 235 nm at most.

However, the silicon substrate 101 is not necessarily etched until the masking of the bismuth oxide film 102 with a thickness of X nm is all removed. In other words, the silicon substrate 101 may be etched to leave some of the masking of the bismuth oxide film 102. In the example, the silicon substrate 101 is etched by about 200 nm (corresponding to d1' in FIG. 8). At this time, the bismuth oxide film 102 is etched by about 15 nm. Therefore, a thickness d2' of the bismuth oxide film 102 after the etching process in FIG. 8 is about 3 nm.

Then, as shown in FIG. 9, a process of removing the remaining bismuth oxide film 102 (in other words, the etching process) is performed. Specifically, for example, the remaining bismuth oxide film 102 is dissolved by the dipping which uses 10% acetic acid aqueous solution and 5% nitric acid aqueous solution.

By this, it is possible to form a pattern with a depth of about 200 nm on the silicon substrate 101. By using such a technology, for example, it is possible to form an imprint transfer mold and various recording media.

In particular, by using the bismuth oxide film 102 as the masking in addition to the electron beam resist 103, the following various benefits can be received.

Firstly, since the etching rate of the bismuth oxide film 102 to the argon gas or $CHF_3$ gas is greater than that of the electron beam resist 103 to the argon gas or $CHF_3$ gas, it is possible to etch the bismuth oxide film 102 in excess of the thickness of the electron beam resist 103 used as the masking. In addition, since the etching rate of the bismuth oxide film 102 to $CF_4$ gas is less than that of the silicon substrate 101 to the $CF_4$ gas, it is possible to etch the silicon substrate 101 in excess of the thickness of the bismuth oxide film 102 used as the masking. In other words, by using the relatively thin masking (specifically, the bismuth oxide film 102 and the electron beam resist 103), it is possible to etch the silicon substrate 101, relatively thickly (i.e. deeply).

If the bismuth oxide film 102 is not used as the masking, it is necessary to relatively thicken the electron beam resist 103 used as the masking for the patterning with respect to the silicon substrate 101. In general, the etching selection ratio between the silicon substrate 101 and the electron beam resist 103 is about 0.6. Therefore, in order to etch the silicon substrate 101 to a depth of 200 nm as in the example, the electron beam resist 103 with a thickness of 333 nm needs to be formed on the silicon substrate 101, as shown in FIG. 10(a). However, if such patterning of the electron beam resist 103 is performed, the electron beam resist 103 left as the masking has a vertically long unstable shape (in other words, a shape with a high aspect ratio), as shown in FIG. 10(b). The unstable shape of the electron beam resist 103 possibly leads to such a disadvantage that the masking is inclined or broken due to its own weight or external pressure or the like, which is not preferable. In the example, however, the bismuth oxide film 102 and the electron beam resist 103 used as the masking can be relatively thinned, so that the aforementioned disadvantage does not occur. Specifically, even if each of the bismuth oxide film 102 and the electron beam resist 103 is 30 nm thick, the silicon substrate 101 can be etched to the depth of 200 nm.

Moreover, since the bismuth oxide film 102 is soluble relatively easily in the weak acid such as 10% acetic acid aqueous solution and 5% nitric acid aqueous solution, it is possible to remove the bismuth oxide film 102 left after the etching process, from the silicon substrate 101, without corroding the silicon substrate 101 which is insoluble or poorly-soluble in the weak acid. As a result, it is possible to preferably form the silicon substrate 101 on which the patterning is performed. In addition, since the bismuth oxide film 102 is removed by the dipping, it is also possible to receive a cleaning effect by that 10% acetic acid aqueous solution and 5% nitric acid aqueous solution operate as a rinse.

Moreover, since the bismuth oxide film 102 is insoluble or poorly-soluble in organic solvent such as n-amyl acetate and in alkaline solution such as TMAH (tetramethylammonium hydroxide solution) used for the development of a chemically-amplified electron beam resist and a photoresist, it is possible to receive such an effect that the bismuth oxide film 102 is not adversely influenced by the development of the electron beam resist 103, which is performed with n-amyl acetate and TMAM or the like. By this, it is possible to remove the electron beam resist 103 exposed without having an adverse effect on the bismuth oxide film 102 (i.e. the latent image 103a), resulting in the preferable patterning of the electron beam resist 103. By this, by using the patterned electron beam resist 103 as the masking, it is possible to preferably perform the patterning on the bismuth oxide film 102.

In addition, even if the electron beam irradiated on the electron beam resist 103 from the upper side of FIG. 3 is transmitted through the bismuth oxide film 102 located on the rear side (the lower side of FIG. 3) of the electron beam resist 103 and even if the transmitted electron beam is scattered in the silicon substrate 101 located on the further rear side, the bismuth oxide film 102 can preferably prevent the electron beam scattered in the silicon substrate 101 from being directed to the electron beam resist 103. Specifically, the bismuth oxide film 102 reflects the electron beam scattered in the silicon substrate 101, by which the electron beam can be preferably prevented from being directed to the electron beam resist 103.

In particular, bismuth is a heavy element, and it is an element with a small electron affinity of the heavy element, so it is poorly reactive with the electron beam. Thus, the high-energy electron beam can be transmitted through the bismuth oxide film 102, relatively easily. The bismuth oxide film 102 can also reflect the low-energy electron beam which is scattered in the silicon substrate 101, relatively easily, as bismuth is the heavy element. In other words, the bismuth oxide film 102 hardly transmits or does not transmit the low-energy electron beam scattered in the silicon substrate 101, from the silicon substrate 101 side to the electron beam resist 103 side. By this, it is possible to prevent the back-exposure of the electron beam resist 103, resulting in maintaining the high patterning accuracy of the electron beam resist 103.

Moreover, the heavy element such as the bismuth oxide film 102 is etched by the argon gas or $CHF_3$ gas, more easily than the metal oxide of a light element. Thus, for example, compared to a case where the metal oxide of a light element is used instead of the bismuth oxide film 102, it is possible to further thin the electron beam resist 103.

It is also known that $Bi_2O_3$, which is the composition of the bismuth oxide film 102, is a stable composition. Thus, the bismuth oxide film 102 is safe and easy in handling.

Here, compared to pure bismuth, as the content of oxygen (oxidation rate) included with bismuth increases, the solubility of the bismuth oxide film 102 in the weak acid increases. On the other hand, as the content of oxygen included with bismuth reduces, the solubility of the bismuth oxide film 102 in the weak acid reduces, but its electrical conductivity increases. The increased electrical conductivity allows the following effect to be received; namely, it is possible to prevent the charge-up of electrons to the bismuth oxide film 102 in the exposure of the electron beam resist 103 by the irradiation of the electron beam.

In view of the two trade-off relations, $0.4 \leq x \leq 0.5$ is preferably established if the relative proportions of bismuth and oxygen is x:1−x. In other words, the content of oxygen in the bismuth oxide film 102 is preferably 50% to 60%. By this, it is possible to realize the bismuth oxide film 102 which approximately receives the following two characteristics: being soluble in the weak acid and preventing the charge-up of electrons.

However, the content of oxygen in the bismuth oxide film 102 is not necessarily 50% to 60%. Even in this case, by setting the appropriate content in view of the two trade-off relations described above, it is possible to receive the aforementioned various effects, appropriately.

In addition, since the bismuth oxide film 102 is not necessarily the pure bismuth oxide film 102 as described above, that increases the degree of freedom for material selection. For example, a $Bi_2Sr_2Ca_2Cu_3O_x$ film has a superconductive material. Thus, by using such a material, an electronic device can be prepared on the silicon substrate 101 as it is.

Moreover, instead of the bismuth oxide film 102, the metal oxide of the heavy element may be used. In this case, it is preferably the metal oxide of the heavy element with the atomic number of 37 or more. Even in such construction, the metal oxide of the heavy element has the same characteristics as those of the bismuth oxide film 102, so that it is possible to receive the aforementioned various effects.

Moreover, in the aforementioned example, in order to form the bismuth oxide film 102 on the silicon substrate 101, bismuth is used as the target and bismuth is sputtered in an oxygen atmosphere. However, the bismuth oxide film 102 may be formed by forming a bismuth film on the silicon substrate 101 before heating it at a relatively low temperature of about 250° C. and by thermally oxidizing only the bismuth film.

Moreover, a bismuth oxide may be used as the target to form the bismuth oxide film 102 on the silicon substrate 101. However, if bismuth as metal is used as the target, it is possible to receive such an advantage that the target can be available more inexpensively than the case where the bismuth oxide is used as the target.

Moreover, the method of forming the bismuth oxide film 102 is not limited to the sputtering. For example, the bismuth oxide film 102 may be formed by a plasma CVD method and a deposition method.

Moreover, in the aforementioned example, the bismuth oxide film 102 is formed on the silicon substrate 101, and the electron beam resist 103 is formed on the bismuth oxide film 102 before the patterning. However, for example, by using a lift-off method or the like, the electron beam resist 103 may be formed on the silicon substrate 101, and the bismuth oxide film 102 may be formed on the electron beam resist 103. In this case, firstly, the electron beam resist 103 is formed on the silicon substrate 101 before the patterning with respect to the electron beam resist 103. After that, the bismuth oxide film 102 is formed on the pattern of the electron beam resist 103 and the exposed silicon substrate 101. Then, the pattern of the electron beam resist 103 and the bismuth oxide film 102 formed on the pattern are removed. As a result, the patterned bismuth oxide film 102 remains, which is formed on the exposed silicon substrate 101.

Moreover, in the aforementioned example, the electron beam resist 103 is used in which the acrylic resin is the base polymer; however, it will be understood that the electron beam resist 103 in which a composition other than the acrylic resin is the base polymer may be also used. Moreover, instead of the patterning using the electron beam lithography technique which uses the electron beam resist 103, the patterning may be performed by a photolithography technique which uses a photoresist. Alternatively, the patterning may be performed by a nanoimprint lithography technique. In this case, it will be understood that various resists corresponding to the lithography technique may be used, instead of the electron beam resist 103.

Moreover, in the aforementioned example, after the etching process of the bismuth oxide film 102, the process of removing the electron beam resist 103 using the oxygen gas is performed; however, the process of removing the electron beam resist 103 using the oxygen gas is not necessarily performed. In this case, since the electron beam resist 103 is removed in the subsequent etching process of the silicon substrate 101, there is no particular problem and the process can be simplified.

Moreover, in the aforementioned example, the bismuth oxide film 102 is etched by dry etching using the argon gas or $CHF_3$ gas; however, a gas other than the argon gas or $CHF_3$ gas may be used for the etching. For example, an inert gas such as helium gas (He), neon gas (Ne), krypton gas (Kr), and xenon gas (Xe); a mixture gas of hydrogen gas and a fluorine-based gas such as $H_2$ gas and $CF_4$ gas, $SF_6$ gas, and $C_2F_2$ gas; another reactive gas including hydrogen such as $CH_2F_2$ gas and $C_2H_2F_6$ gas; and a chlorine-based gas such as $Cl_2$ gas and $BCl_2$ gas may be used to perform the etching process on the bismuth oxide film 102. Moreover, instead of the dry etching using the ICP-RIE apparatus, dry etching using an ion milling apparatus, dry etching using a capacitively-coupled reactive ion etching apparatus, and dry etching using a focused ion beam processing apparatus which uses gallium ion or the like may be used to etch the bismuth oxide film 102. Moreover, the various conditions in the etching are preferably set in accordance with the type and characteristics of the electron beam resist 103 (or a resist used instead of the electron beam resist 103) and the bismuth oxide film 102 (or an oxide material used instead of the bismuth oxide film 102).

Moreover, in the aforementioned example, the silicon substrate 101 is etched by the dry etching using the $CF_4$ gas; however, a gas other than the $CF_4$ gas may be used for the etching. For example, a fluorocarbon-based gas (i.e. fluorine-based gas) such as $C_2F_6$ gas, sulfurfluoride-based gas (i.e. fluorine-based gas) such as $SF_6$ gas, and a chlorine-based gas such as $Cl_2$ gas and $BCl_2$ gas may be used to perform the etching process on the bismuth oxide film 102. Moreover, instead of the dry etching using the ICP-RIE apparatus, dry etching using a capacitively-coupled reactive ion etching apparatus may be used to etch the silicon substrate 101. Moreover, the various conditions in the etching are preferably set in accordance with the type and characteristics of the bismuth oxide film 102 (or an oxide material used instead of the bismuth oxide film 102) and the silicon substrate 101 (or a substrate which is the patterning target, instead of the silicon substrate 101).

Moreover, the aforementioned example explained an example of the patterning of the silicon substrate 101; however, it will be understood that the same patterning may be performed on other various substrates or materials instead of the silicon substrate 101.

The processes explained in FIG. 1 to FIG. 9 are one specific example, and various changes may be made, if desired, in order to solve the practical problems such as a reduction in the number of processes of transfer of a substrate between apparatuses.

Moreover, the aforementioned example explained an example of the patterning using the silicon substrate 101, the bismuth oxide film 102, and the electron beam resist 103 (i.e. an example of the two-stage etching process); however, the layer used as the masking may be further increased. In other words, a multistage etching process, i.e. three-stage or more etching process, may be performed.

For example, a magnetic film, a titanium film (Ti) or a tantalum film (Ta), the bismuth oxide film 102, and the electron beam resist 103 are laminated on a glass substrate in this order, and each of the titanium film (Ti) or tantalum film (Ta), the bismuth oxide film 102, and the electron beam resist 103 may be used as the masking. In this case, firstly, the pattern of the electron beam resist 103 is formed, and then the electron beam resist 103 is used as the masking to perform the etching process on the bismuth oxide film. Then, the bismuth oxide film 102 is used as the masking to perform the etching process on the titanium film (Ti) or tantalum film (Ta). Then, the titanium film (Ti) or tantalum film (Ta) is used as the masking to perform the etching process on the magnetic film. As a result, the magnetic film is patterned. In this example, the three-stage etching process is performed.

Now, on the basis of the drawings, an explanation will be given on an example of the recording medium of the present invention produced by applying the aforementioned method, FIGS. 11 to FIG. 13 are schematic diagrams of a production procedure in the example of the recording medium of the present invention.

In FIG. 11(a), firstly, in advance, a recording film layer 205 is formed by sputtering or the like on a base substrate 201 of a recording medium. If the recording film layer 205 is a perpendicular magnetic recording medium, it is a laminated structure such as a soft magnetic underlayer, an interlayer, and a ferromagnetic recording layer. Moreover, metal mask layer 204 such as Ta and Ti is formed by sputtering or the like on the recording film layer 205, and an oxide material layer 202 such as the bismuth oxide film 102 in the example is formed by sputtering or the like on the metal mask layer 204. A concavo-convex pattern is formed by patterning using the electron beam lithography technique with the electron beam resist 103 on the oxide material layer 202, by patterning using the photolithography technique with a photoresist, by patterning using the nanoimprint lithography technique. The resist material can be appropriately selected in accordance with the patterning technique to be used.

After that, FIG. 11(b), FIG. 11(c), FIG. 11(d), and FIG. 12(a) show the pattern formation of the oxide material layer 202 using the method of forming a pattern of the present invention. FIG. 11(b) shows that with a resist 203 used as the masking, the etching process is performed on the resist 203 and the oxide material layer 202. FIG. 11(c) shows that the remaining resist 2-3 is removed by a wet process or dry ashing. FIG. 11(d) shows that the etching process is performed on the oxide material layer 202 and the metal mask layer 204, with the oxide material layer 202 as the masking. FIG. 12(a) shows that the remaining oxide material layer 202 is removed by dry etching or a wet process using a weak acid.

As shown in FIG. 12(b), moreover, as the multistage etching process, the etching process is performed on the metal ask layer 204 and the recording film layer 205, with the metal mask layer 204 being used as the masking. As shown in FIG. 12(c), the remaining metal mask layer 204 is removed by a wet process or dry etching. Then, the groove portion of the pattern is filled with a non-recording material 206 which is a material not to be recorded (a nonmagnetic material in case of a magnetic recording medium) by sputtering, an application process, or the like, to thereby provide FIG. 12(d). The surface of this is grinded and polished by etch back, chemical polishing, or the like to provide flattening. By this, it is possible to produce such a structure that the recording material is divided by the non-recording material 206, as shown in FIG. 12(e).

Moreover, a film 207 such as a lubricant film and a protective film of the recording film layer 205 is formed on the surface by an application method and a dipping method, to complete a recording medium 200 shown in FIG. 13. In case of magnetic recording media, it is incorporated in a hard disk drive to provide discrete track media and patterned media.

The present invention is not limited to the aforementioned example, and various changes may be made, if desired, without departing from the essence or spirit of the invention which can be read from the claims and the entire specification. An oxide material, a patterning substrate, a method of forming a pattern, a method of producing an imprint transfer mold, a method of producing a recording medium, an imprint transfer mold, and a recording medium, all of which involve such changes, are also intended to be within the technical scope of the present invention.

The invention claimed is:

1. A substrate for patterning by etching, comprising:
a silicon substrate;
a bismuth oxide film formed on an upper surface of the silicon substrate; and
an electron beam resist layer formed on the bismuth oxide film.

2. The substrate according to claim 1, wherein the bismuth oxide comprises bismuth in an amount (x) of 0.4<x<0.5, and a relative proportion of bismuth and oxygen in the bismuth oxide is x:1−x.

3. The substrate according to claim 1, wherein the bismuth oxide film comprises $Bi_2O_3$ and one or more components selected from the group consisting of: Ti (titanium), V (vanadium), Cr (chromium), Mn (manganese), Fe (iron), Co (cobalt), Ni (nickel), Cu (copper), Zn (zinc), Zr (zirconium), Nb (niobium), Mo (molybdenum), Ru (ruthenium), Pd (palladium), Ag (silver), Cd (cadmium), Ta (tantalum), W (tungsten), Pt (platinum), Au (gold), Al (aluminum), Si (silicon), Ga (gallium), Ge (germanium), In (indium), Sn (tin), Sb (antimony), Mg (magnesium), Ca (calcium), Sr (strontium), nitrogen, metal nitride, carbon, metal carbide, sulfur and metal sulfide.

4. The substrate according to claim 1, wherein an etching rate of the bismuth oxide film is greater than the etching rate of the resist layer, in an etching process from argon gas or trifluoromethane ($CHF_3$) gas.

5. The substrate according to claim 4, wherein the etching rate of the bismuth oxide film is about 1.1 times greater than the etching rate of the resist layer.

6. The substrate according to claim 1, wherein an etching rate of the bismuth oxide film is less than the etching rate of the substrate layer, in an etching process from tetrafluoromethane ($CF_4$) gas.

7. The substrate according to claim 6, wherein the etching rate of the silicon substrate is about 13.1 times greater than the etching rate of the bismuth oxide film layer.

8. The substrate according to claim 1, further comprising one or more additional layers formed on the electron beam resist layer, the one or more additional layers selected from the group consisting of: a magnetic film, a titanium film and a tantalum film.

9. A masking material for pattern etching a substrate, comprising bismuth oxide, wherein the bismuth oxide comprises bismuth in an amount (x) of $0.4<x<0.5$, and a relative proportion of bismuth and oxygen in the bismuth oxide is $x:1-x$.

10. The masking material according to claim 9, consisting essentially of bismuth oxide.

11. The masking material according to claim 9, comprising $Bi_2O_3$ and one or more components selected from the group consisting of: Ti (titanium), V (vanadium), Cr (chromium), Mn (manganese), Fe (iron), Co (cobalt), Ni (nickel), Cu (copper), Zn (zinc), Zr (zirconium), Nb (niobium), Mo (molybdenum), Ru (ruthenium), Pd (palladium), Ag (silver), Cd (cadmium), Ta (tantalum), W (tungsten), Pt (platinum), Au (gold), Al (aluminum), Si (silicon), Ga (gallium), Ge (germanium), In (indium), Sn (tin), Sb (antimony), Mg (magnesium), Ca (calcium), Sr (strontium), nitrogen, metal nitride, carbon, metal carbide, sulfur and metal sulfide.

* * * * *